(12) United States Patent
He

(10) Patent No.: US 7,868,703 B2
(45) Date of Patent: Jan. 11, 2011

(54) PASSIVE SPECTRUM CONTROL FOR PULSED RF POWER AMPLIFIERS

(75) Inventor: Liewei He, Baltimore, MD (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/434,178

(22) Filed: May 1, 2009

(65) Prior Publication Data
US 2010/0277243 A1   Nov. 4, 2010

(51) Int. Cl.
*H03F 3/19* (2006.01)
(52) U.S. Cl. ........................... 330/310; 330/302
(58) Field of Classification Search ......... 330/310–311, 330/302, 150, 133
See application file for complete search history.

(56) References Cited

U.S. PATENT DOCUMENTS

| 6,489,862 | B1 * | 12/2002 | Frank ......................... 333/187 |
| 7,468,636 | B2 * | 12/2008 | Matsuda et al. ............. 330/302 |
| 7,602,240 | B2 * | 10/2009 | Gao et al. .................... 330/98 |

* cited by examiner

*Primary Examiner*—Hieu P Nguyen
(74) *Attorney, Agent, or Firm*—Lando & Anastasi, LLP

(57) ABSTRACT

A multi-stage RF power amplifier including passive circuitry for frequency spectrum control. In one example, a multi-stage RF power amplifier includes a first RF power transistor, a second RF power transistor, and a passive combination band-pass filter and impedance matching network coupled between the first RF power transistor and the second RF power transistor.

13 Claims, 9 Drawing Sheets

PASSIVE SPECTRUM CONTROL FOR PULSED RF POWER AMPLIFIERS

BACKGROUND

1. Field of Invention

The present invention is in the field of electronics, and more particularly, is directed to radio frequency amplifiers.

2. Discussion of Related Art

Solid state Class-C power transistors used for pulsed radio frequency (RF) power amplifiers suffer from frequency spectrum problems, mainly caused by ringing from the pulse falling edge. Consequently, conventional high power, pulsed, multi-stage, RF power amplifiers that require frequency spectrum control use either active pulse/tail clipper circuitry, active analog pulse ramp control, or a passive cavity bandpass filter to provide the needed control.

Referring to FIG. 1, there is illustrated a block diagram of a three-stage power amplifier using pulse/tail clipper circuitry for frequency spectrum control. The three-stage power amplifier 100 includes three RF power transistors 110 coupled between an input 120 and output 130 of the amplifier. Impedance matching networks 140a and 140b are coupled between the input 120 and the first RF power transistor 110 and between the third RF power transistor and the output 130, respectively, as shown in FIG. 1. Impedance matching networks 140c and 140d are provided between the RF stages, as also shown in FIG. 1. The frequency control block 150 includes a pulse clipper drive circuit 160 coupled to the impedance matching network 140d between the second and third RF power transistors 110 (i.e., between the middle and end stages) via a capacitor 170.

Another conventional method to achieve spectral compliance includes using an active analog pulse ramp/fall time control system at the beginning of the multi-stage power amplifier chain. An example of a three-stage power amplifier 100 including ramp/fall time control circuitry 180 for frequency spectrum control is shown in FIG. 2. The ramp/fall time control circuitry 180 is coupled to the output of the first RF power transistor 110, i.e., to the beginning stage of the amplifier 100. FIG. 3 illustrates an example of the three-stage power amplifier 100 including circuitry for the third conventional method of frequency spectrum control, namely, using a passive cavity filter at the end of the multi-stage power amplifier chain. As shown in FIG. 3, a cavity bandpass filter 190 is coupled between the output of the impedance matching network 140b and the output 130 of the power amplifier 100.

Each of three conventional methods of frequency spectral control has associated disadvantages and drawbacks. The active pulse/tail clipper and pulse ramp/fall time control methods use complicated circuitry and require a large footprint on a printed circuit board design. In addition, the pulse clipper and pulse ramp/fall time control methods have active circuitry, which consumes power, and are costly due to the complicated circuitry and large footprint required. Another significant disadvantage of these methods is their poor performance at temperature extremes. The cavity bandpass filter is a large assembly external from the power amplifier and has undesirable high insertion loss which significantly reduces the total power output of the power amplifier.

SUMMARY OF INVENTION

Aspects and embodiments are directed to a frequency spectrum control technique that uses a passive bandpass filter/matching network combination at each stage of a multi-stage RF amplifier. As discussed above, conventional techniques for spectrum control have several associated disadvantages, such as poor performance at extreme temperatures, large footprint, and relatively high cost due to the large size and complexity of the circuitry involved. At least one embodiment discussed herein provides a frequency spectrum control technique that alleviates or eliminates the shortcomings of conventional designs.

According to one embodiment, a multi-stage RF power amplifier comprises a first RF power transistor, a second RF power transistor, and a passive network including a passive bandpass filter and a passive impedance matching network, the passive network coupled between the first RF power transistor and the second RF power transistor. In one example, the passive impedance matching network includes a microstrip impedance matching network. In another example, the passive bandpass filter includes a microstrip step bandpass filter. In another example, the passive bandpass filter includes an LC filter comprising at least one discrete inductor and at least one discrete capacitor. The multi-stage RF power amplifier may further comprise an input and an output, and a first additional passive network coupled between the input and the first RF power transistor. In one example, the multi-stage RF power amplifier further comprises a second additional passive network coupled between the second RF power transistor and the output.

According to another embodiment, a multi-stage RF power amplifier comprises an input, an output, a plurality of amplifier stages coupled in series between the input and the output, and a plurality of passive networks including a first passive network coupled between the input and a first one of the plurality of amplifier stages, and a second passive network coupled between a last one of the plurality of amplifier stages and the output, wherein a remainder of the plurality of passive networks are coupled in an arrangement having one passive network between each two amplifier stages of the plurality of amplifier stages, and wherein each passive network comprises a combination of a bandpass filter and an impedance matching network. In one example, each of the plurality of passive networks comprises a microstrip impedance matching network and a microstrip step bandpass filter. In another example, each of the plurality of passive networks comprises a microstrip impedance matching network and an LC bandpass filter.

Another embodiment is directed to a multi-stage RF power amplifier comprising an input, an output, a plurality of amplifier stages coupled in series between the input and the output, and a plurality of passive circuits, each passive circuit including a bandpass filter and an impedance matching network, and each passive circuit respectively coupled between two amplifier stages of the plurality of amplifier stages. In one example, each of the plurality of passive circuits comprises a microstrip impedance matching network and a microstrip step bandpass filter. In another example, each of the plurality of passive circuits comprises a microstrip impedance matching network and an LC bandpass filter. In another example, the plurality of amplifier stages comprises a first amplifier stage, a second amplifier stage and a third amplifier stage, and the plurality of passive circuits includes a first passive circuit coupled between the first amplifier stage and the second amplifier stage, and a second passive circuit coupled between the second amplifier stage and the third amplifier stage. Each amplifier stage of the plurality of amplifier stages may comprise an RF power transistor.

According to another embodiment, a method of providing frequency spectrum control for a multi-stage RF amplifier includes passively bandpass filtering an output signal from a first stage of the multi-stage RF amplifier, and providing the filtered output signal to a second stage of the multi-stage RF amplifier. The method also includes providing passive impedance matching between an output of the first stage of the multi-stage RF amplifier and an input of the second stage of the multi-stage RF amplifier. In one example, a combination circuit is used to provide the passive impedance matching and the passive bandpass filtering. The method may also include providing passive impedance matching and bandpass filtering at an input of the first stage of the multi-stage RF amplifier, and/or at an output of the second stage of the multi-stage RF amplifier.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. Where technical features in the figures, detailed description or any claim are followed by references signs, the reference signs have been included for the sole purpose of increasing the intelligibility of the figures, detailed description, and/or claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. In the figures:

DETAILED DESCRIPTION

Aspects and embodiments are directed to apparatus and methods for frequency spectrum control of an RF amplifier. In contrast to conventional designs that require active circuitry for frequency spectrum control, one embodiment includes a hardware design technique for multi-stage, high power, pulsed, RF power amplifiers that uses passive circuitry for frequency spectrum control. In particular, aspects and embodiments are directed to a frequency spectrum control technique that uses a combination of a passive bandpass filter and an impedance matching network at each stage of the RF power amplifier, as discussed further below.

It is to be appreciated that embodiments of the methods and apparatus discussed herein are not limited in application to the details of construction and the arrangement of components set forth in the following description or illustrated in the accompanying figures. The methods and apparatus are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, and upper and lower are intended for convenience of description, not to limit the present systems and methods or their components to any one positional or spatial orientation.

Figure 1:
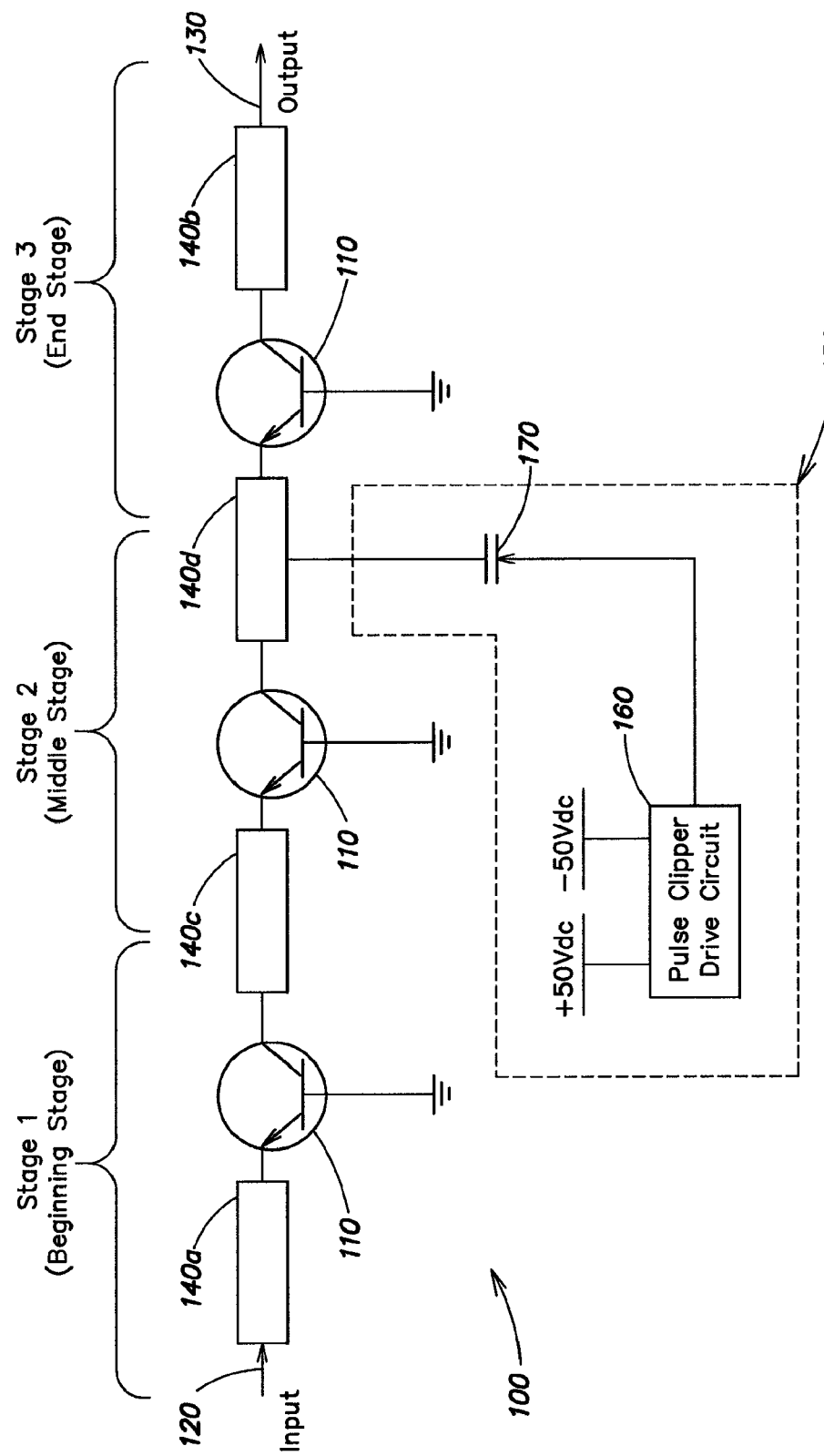
FIG. 1 is a block diagram of a conventional RF power amplifier using the pulse clipper method for frequency spectrum control.
Figure 2:
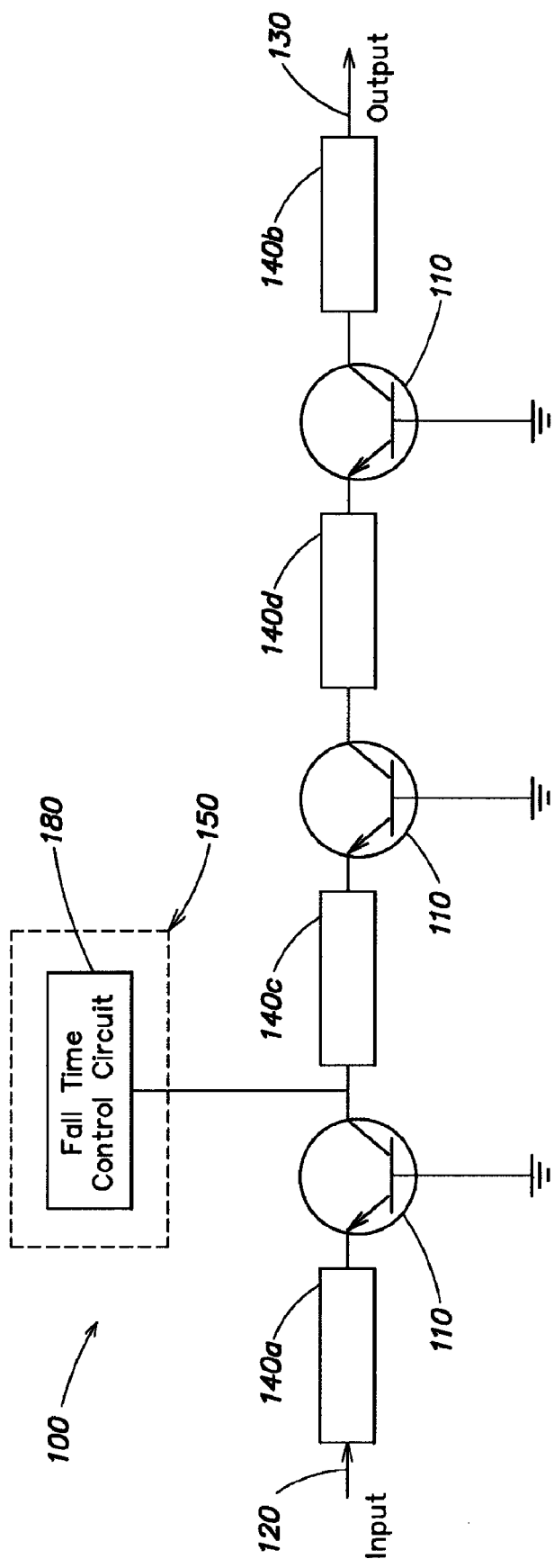
FIG. 2 is a block diagram of a conventional RF power amplifier using the pulse ramp/fall time control method for frequency spectrum control.
Figure 3:
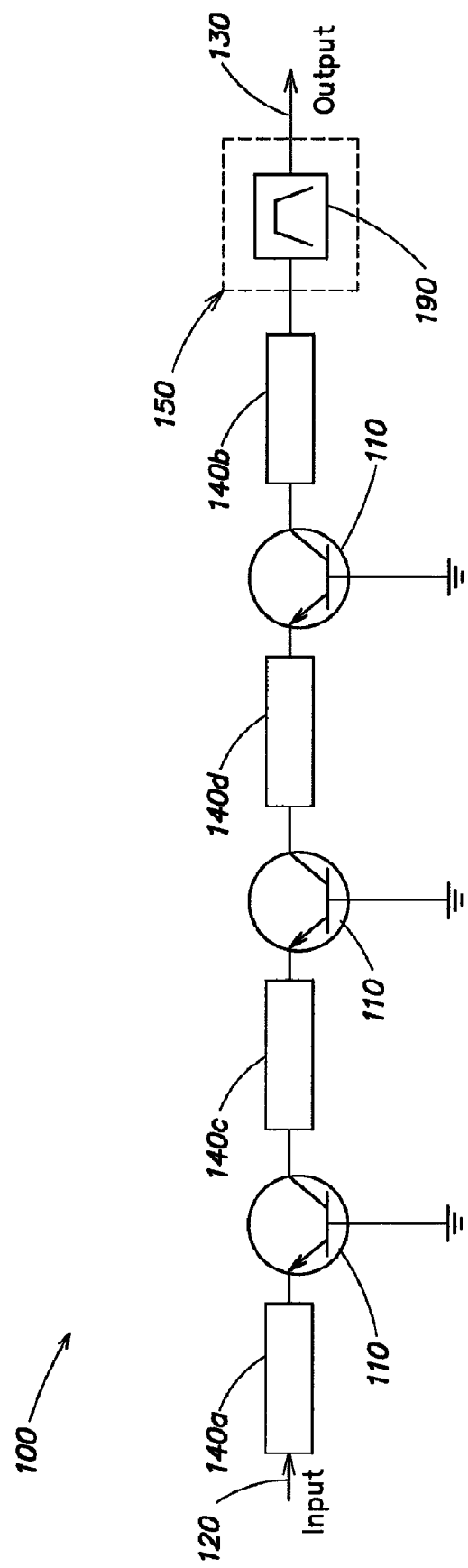
FIG. 3 is a block diagram of a conventional RF power amplifier using a cavity filter for frequency spectrum control.

As discussed above, conventional multi-stage RF power amplifiers include impedance matching networks 140a-d at the different stages of the amplifier, as shown in FIG. 1. According to one embodiment, at least some of these impedance matching networks are modified or replaced with combination impedance matching and bandpass filtering circuitry (referred to herein as a filter/matching network combination) that performs both impedance matching and frequency spectrum control functions, as discussed further below. For example, bandpass filtering can be incorporated into the impedance matching network. This technique results impedance matching between stages as well as spectrum control.

Example simulations and hardware implementations have demonstrated that at each stage of the power amplifier, a passive bandpass filter/matching network combination resulted in a well controlled frequency spectrum, low insertion loss, excellent performance at temperature extremes, a low cost printed circuit board design, and a relatively small footprint, as discussed further below.

Figure 4:
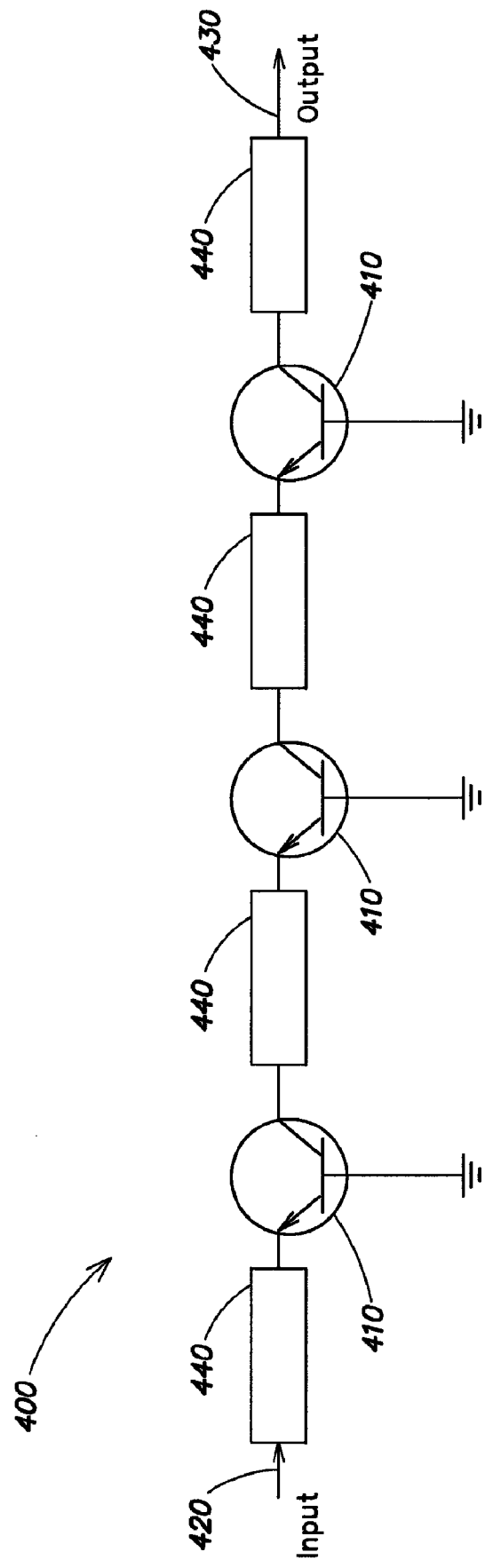
FIG. 4 is a block diagram of one example of a multi-stage RF amplifier including passive frequency spectrum control according to aspects of the invention.

Referring to FIG. 4, there is illustrated a block diagram of one example of a three-stage RF power amplifier 400 including filter/matching network combinations 440 at each stage of the amplifier. The three-stage amplifier 400 includes three RF power transistors 410, one for each stage, coupled between an input 420 and output 430 of the amplifier. It is to be appreciated that although a three-stage amplifier is illustrated in FIG. 4 and the following discussion may refer to a three-stage amplifier, embodiments of the invention may be applied to a multi-stage RF power amplifier comprising any number of stages, not limited to three.

A band pass filter can be implemented, for example, with microstrip track, discrete inductor/capacitor components (e.g., an LC network) or other designs as known to those skilled in the art. The conventional power amplifiers discussed above use microstrip tracks disposed on the printed circuit board for the impedance matching networks 140. According to one embodiment, a bandpass filter is implemented using microstrip tracks. Thus, the bandpass filter can be incorporated into the filter/matching network combination by modifying the microstrip tracks used for impedance matching and/or by adding additional tracks. For example, the filter/matching network combination can include a microstrip step bandpass filter that uses microstrip tracks with different widths, and thus different frequency characteristics, to achieve a desired passband. In this example, in which the filter/matching network combination is implemented in microstrip, the filter/matching network combination entirely passive.

According to another embodiment, the filter/matching network combination comprises a hybrid microstrip and discrete LC network. In one example, discrete inductors and capacitors are used, in conjunction with a microstrip impedance matching network, to provide a bandpass filter. It is to be appreciated that the discrete LC network may also contribute to the impedance matching, and/or the microstrip tracks may be constructed to also contribute to the filtering function. The discrete components may include, for example, surface mount inductors and/or capacitors, printed inductors, such as spiral inductors, lead-based capacitors and/or inductors, etc. Some discrete components, for example, surface mount components, are very small and thus, embodiments of the hybrid filter/matching network combination may have a smaller footprint than the microstrip-only filter/matching network combination. In addition, the filter/matching network combination may again be entirely passive, using only the microstrip tracks and discrete passive components.

As discussed above, in one embodiment, the discrete LC network forms a bandpass filter for spectrum control. The band-pass filter can be constructed using a combination of capacitors and inductors with values selected to achieve a desired overall passband. In one example, the band-pass filter can be contrasted using a combination of lowpass and highpass filter stages. For example, a bandpass filter can be constructed using a series combination of multiple Pi-type and/or T-type lowpass or highpass filter stages, for example, two T-type stages and two Pi-type stages. As will be recognized by those skilled in the art given the benefit of this disclosure, there are many variations of configurations of bandpass filters that may be used and tuned for a desired passband, and embodiments of the invention are not limited to any one particular configuration.

Thus, embodiments of the filter/matching network combination may be constructed using only passive elements, without requiring any active components. As a result, the filter/matching network combination may not require power, unlike the conventional active circuitry frequency spectrum control methods discussed above. In addition, embodiments of the filter/matching network combination may require no complex circuitry, and may use no active components that may be prone to failure or that operate only within a limited temperature range. Accordingly, embodiments of the filter/matching network combination may alleviate or eliminate at least some of the shortcomings associated with conventional active frequency spectrum control methods and provide a less complex, lower cost, and robust technique for frequency spectrum control.

The following examples serve to illustrate some of the novel features, aspects and examples of the technology disclosed herein and should not be construed as limiting the scope of the appended claims. Furthermore, the following examples discuss a filter/matching network combination placed between the first and second stages of a three-stage RF power amplifier; however, it is to be appreciated that the filter/matching network combination may be used between any or all of the stages of a multi-stage RF amplifier.

Example 1

An RF power amplifier including an example of a microstrip filter/matching network combination was simulated as follows. In this example, the filter/matching network combination was placed between the first and second stages of the RF amplifier. The first stage included an APT 7 Watt (W) RF transistor 410 having an output impedance of 6.5-j10 Ohms. The second stage included an Integra 140 W transistor having an input impedance of 6.8+j7.2 Ohms.

Figure 5:
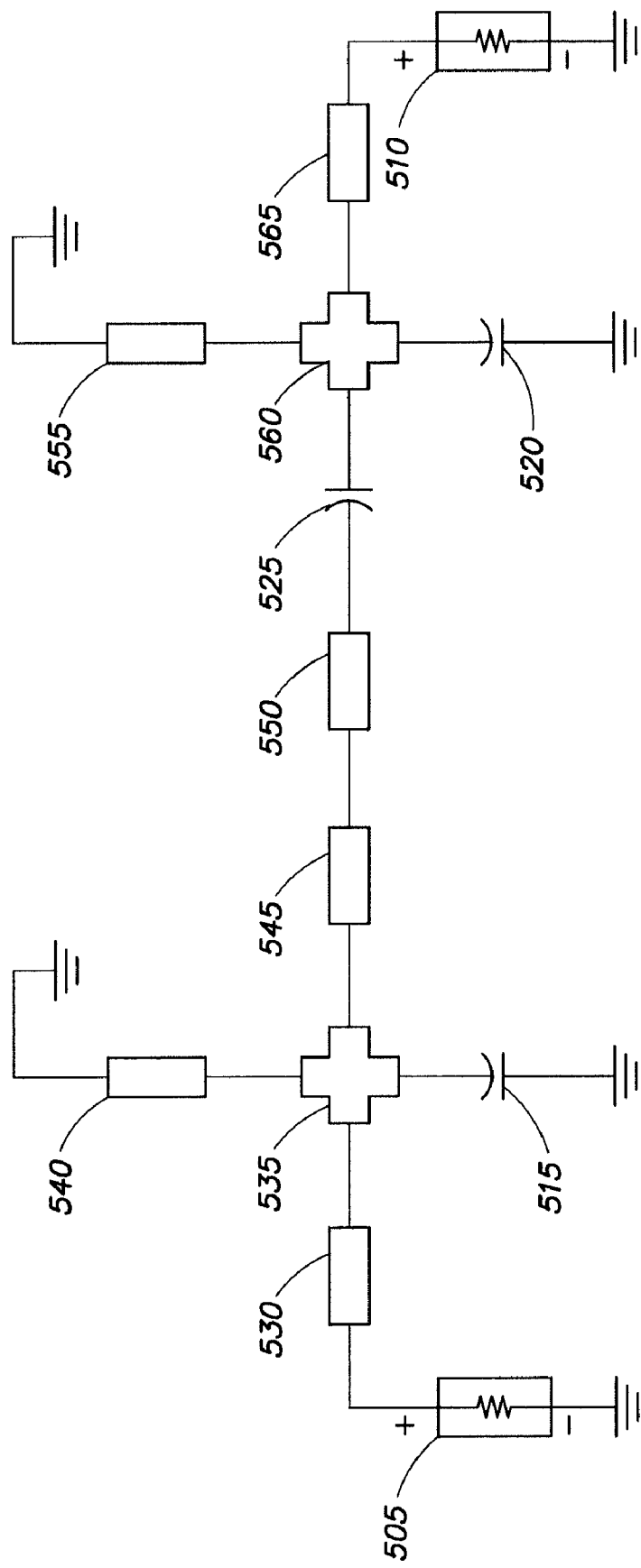
FIG. 5 is a CAD representation of one example of a simulated microstrip filter/matching network according to aspects of the invention.

FIG. 5 illustrates the RF CAD (computer aided design) design for this example microstrip filter/matching network. The terminations 505 and 510 were specified with the above-mentioned output and input impedances of the first and second stage RF transistors, respectively. Capacitors 515 and 520 are shunt capacitors to ground. In one simulation, capacitor 515 had a value of 3.73 picofarads (pF) and capacitor 520 had a value of 4.005 pF. In one simulation, capacitor 525 was given a value of 50 pF. Capacitors 515, 520 and 525 represent capacitance in the filter/matching network. The substrate was specified as follows:

Height=25 mil
Relative permittivity/dielectric constant (Er)=10.2
Relative permeability ($\mu r$)=1
Conductivity=$5.8 \times 10^7$
Height between PC board and cover (Hu)=3.9e+3.4 mil
Copper thickness (T)=1.7 mil (1 oz of Copper has a thickness of about 1.4 mil)
Loss tangent (TanD)=0.0025
Roughness=0.015 mil For one simulation, the microstrip lines 530-565 were specified in terms of their lengths and/or widths, as shown in Table 1 below.

TABLE 1

| Microstrip line | Characteristic | Value (mil) |
|---|---|---|
| 530 | Length | 173.7 |
| | Width | 600 |
| 535 | Width (W1) | 600 |
| | Width (W2) | 25 |
| | Width (W3) | 600 |
| | Width (W4) | 25 |
| 540 | Length | 25 |
| | Width | 600 |
| 545 | Length | 2225 |
| | Width | 20 |
| 550 | Length | 215.385 |
| | Width | 250 |
| 555 | Length | 850 |
| | Width | 25 |
| 560 | Width (W1) | 758 |
| | Width (W2) | 25 |
| | Width (W3) | 758 |
| | Width (W4) | 25 |
| 565 | Length | 294.2 |
| | Width | 758 |

Figure 6:
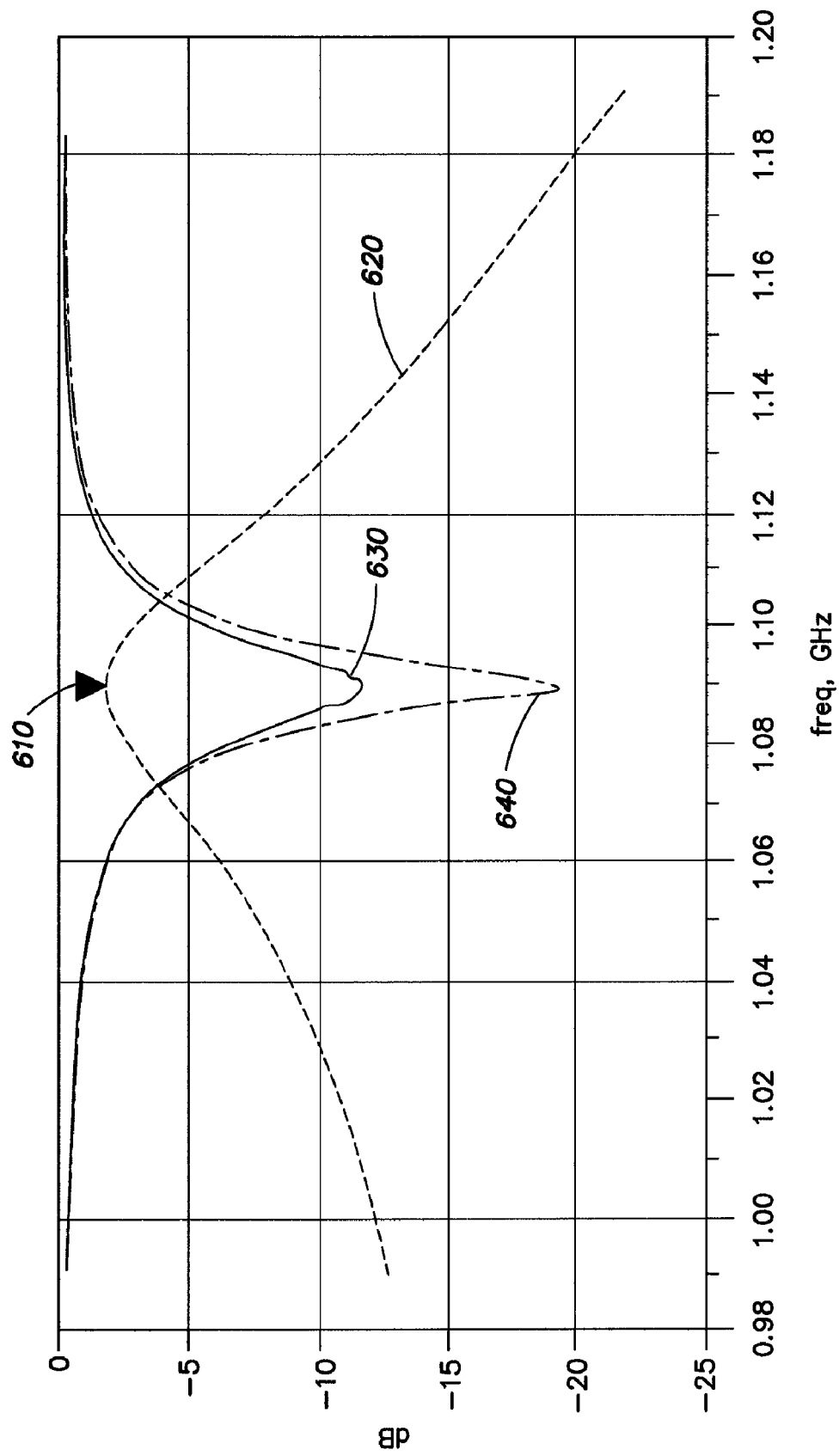
FIG. 6 is a plot of simulated RF characteristics for an example of the simulated microstrip filter/matching network of FIG. 5.

Referring to FIG. 6, there are illustrated plots of the simulated RF characteristics for an example microstrip filter/matching network with the component values and characteristics as specified above and shown in FIG. 5. The simulation was stepped in 0.5 MHz steps from 0.99 GHz to 1.19 GHz. Marker 610 indicates a center frequency of 1.090 GHz. Trace 620 represents the simulated insertion loss from the input termination 505 to the output termination 510. Trace 630 represents the return loss at termination 505 and trace 640 represents the return loss at termination 510.

Example 2

An RF power amplifier including an example of a hybrid microstrip and discrete LC filter/matching network combination was simulated as follows. In this example, the filter/matching network combination was placed between the second and third stages of the RF amplifier. The second stage included a high power class C amplifier RF transistor having an output impedance of 4.3-j0.5 Ohms. The third stage also included a high power class C amplifier RF transistor having an input impedance of 1.77+j1.63 Ohms.

Figure 7:
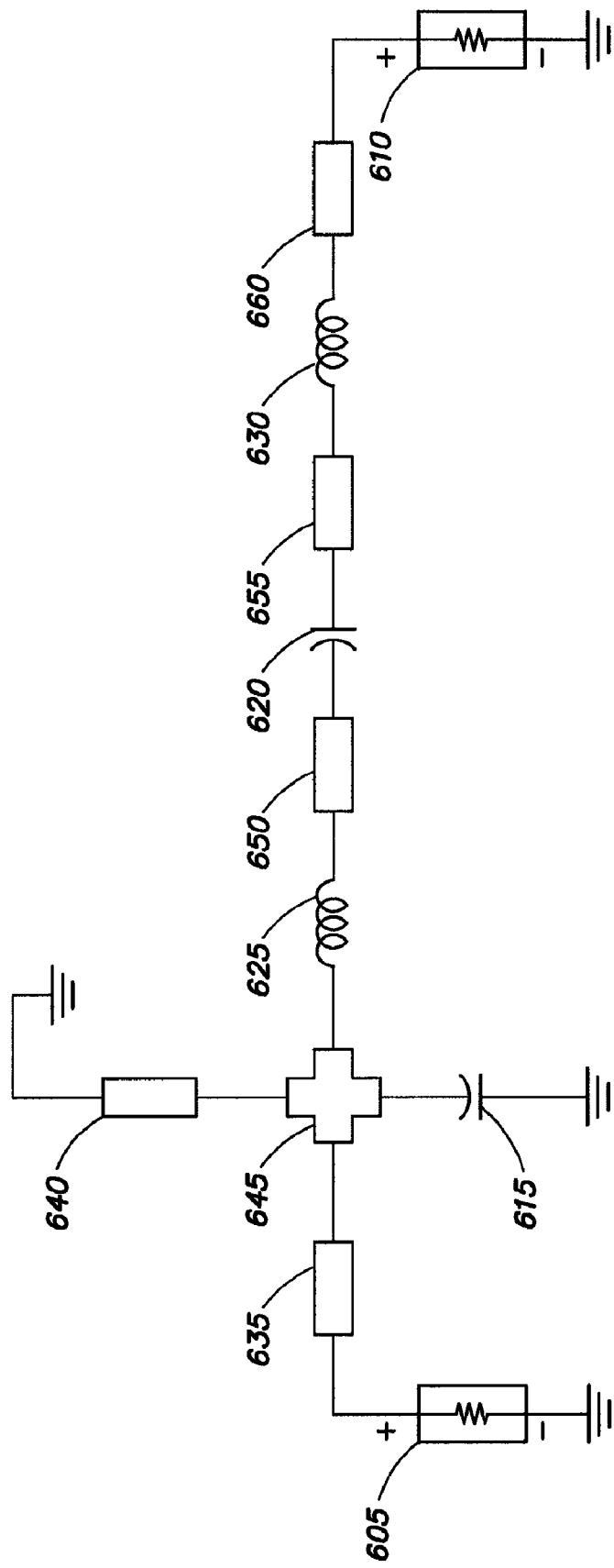
FIG. 7 is a CAD representation of one example of a simulated hybrid filter/matching network according to aspects of the invention.

FIG. 7 illustrates the RF CAD design for this example hybrid filter/matching network. The terminations 605 and 610 were specified with the above-mentioned output and input impedances of the second and third stage RF transistors, respectively. As discussed above, the hybrid example includes both discrete capacitors 615, 620 and inductors 625, 630, as well as microstrip lines 635-660. In one simulation, capacitor 615 was given a value of 3.65 pF and capacitor 620 was given a value of 110 pF. Inductor 625 was specified at 9.86 nanohenries (nH), with a Q of 125, a cut-off frequency (F) of 100 MHz and a DC resistance (Rdc) of zero Ohms. Inductor 630 was specified at 5.6 nH, with a Q of 100, F=100 MHz and Rdc=0 Ohms. The substrate was specified as follows:

Height=25 mil
Er=10.2
μr=1
Conductivity=$5.8 \times 10^7$
Hu=3.9e+3.4 mil
T=0.14 mil
TanD=0.0025
Roughness=0.001 mil For one simulation, the microstrip lines 530-565 were specified in terms of their lengths and/or widths, as shown in Table 2 below.

TABLE 2

| Microstrip line | Characteristic | Value (mil) |
|---|---|---|
| 635 | Length | 90 |
| | Width | 350 |
| 640 | Length | 610 |
| | Width | 25 |
| 645 | Width (W1) | 250 |
| | Width (W2) | 25 |
| | Width (W3) | 250 |
| | Width (W4) | 25 |
| 650 | Length | 130 |
| | Width | 323 |
| 655 | Length | 60 |
| | Width | 230 |
| 660 | Length | 120 |
| | Width | 510 |

Figure 8:
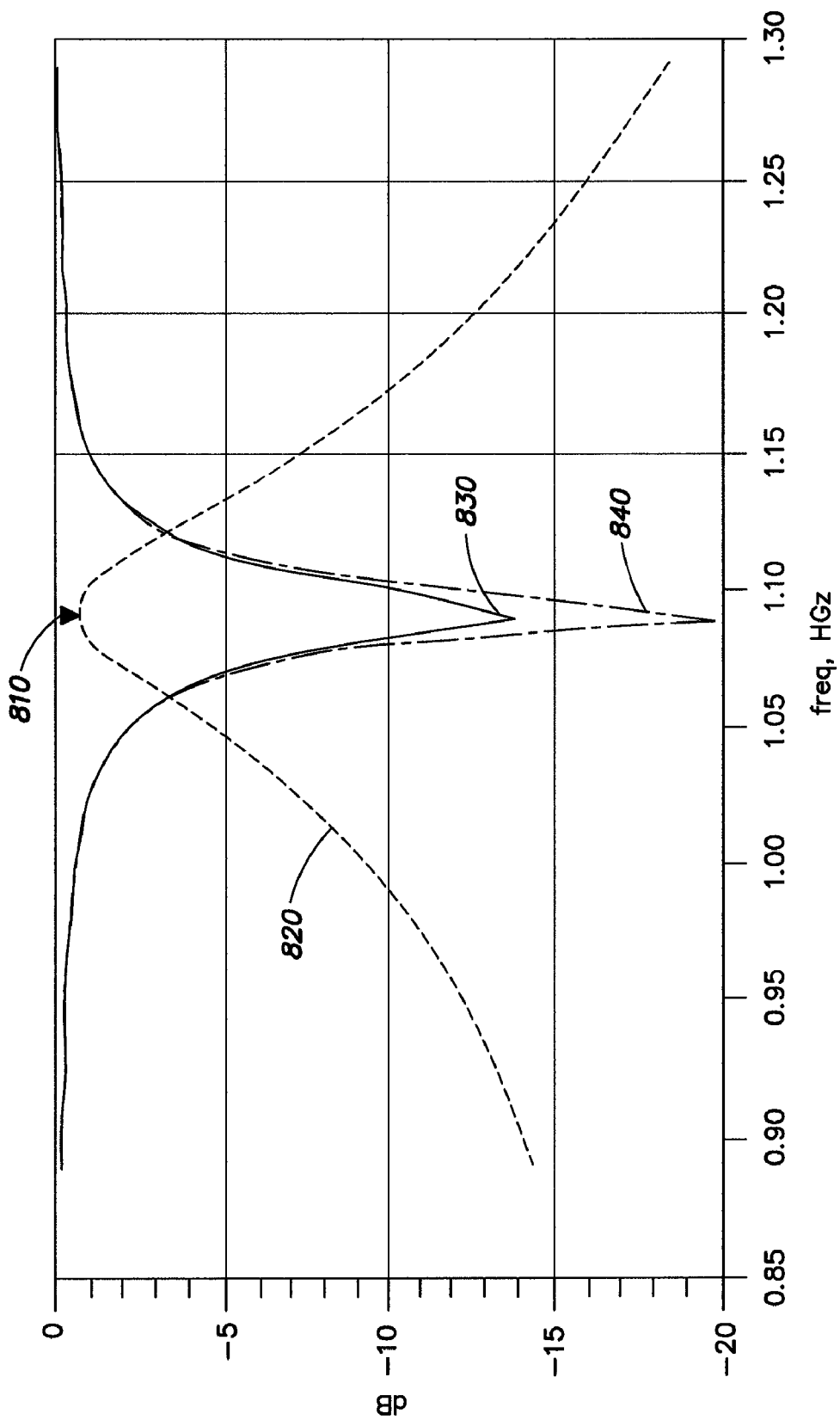
FIG. 8 is a plot of simulated RF characteristics for an example of the simulated hybrid filter/matching network of FIG. 7.

Referring to FIG. 8, there are illustrated plots of the simulated RF characteristics for an example hybrid filter/matching network with the component values and characteristics as specified above and shown in FIG. 7. The simulation was stepped in 0.01 GHz steps from 0.89 GHz to 1.29 GHz. Marker 810 indicates a center frequency of 1.090 GHz. Trace 820 represents the simulated insertion loss from the input termination 605 to the output termination 610. In the illustrated example, at the center frequency, the insertion loss was 0.623 dB. Trace 830 represents the return loss at termination 605 and trace 840 represents the return loss at termination 610.

Example 3

An example three stage RF power amplifier with a microstrip impedance matching/microstrip step bandpass filter combination was fabricated. This example RF power amplifier used an input RF power of 1 Watt and provided an output power of 800 Watts. The footprint of this RF power amplifier was 4.5 inches by 2.5 inches. These dimensions are comparable to those of a similar three-stage RF power amplifier using one of the conventional frequency spectrum control methods discussed above.

Example 4

An example of a three-stage RF power amplifier including a microstrip impedance matching network and discrete LC bandpass filter combination was fabricated. This example RF power amplifier used an input RF power of 1 Watt and provided an output power of 800 Watts. The footprint of this RF power amplifier was 2.5 inches by 1.5 inches; approximately half the size of the all microstrip example.

Figure 9:
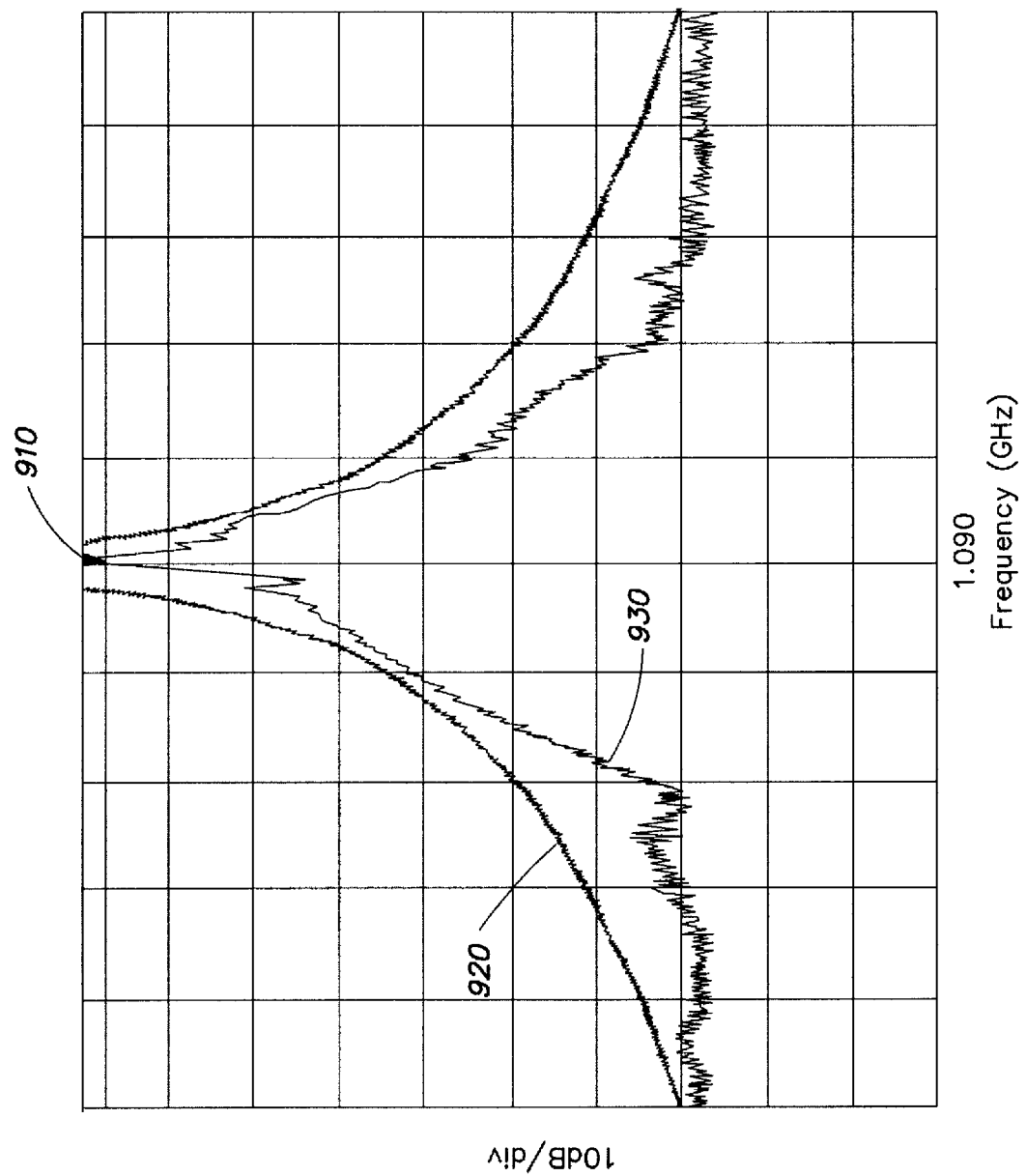
FIG. 9 is a plot of a measured frequency response for one example of an RF power amplifier including a hybrid bandpass filter/impedance matching network according to aspects of the invention.

FIG. 9 illustrates a measured frequency spectrum plot for this example RF power amplifier. The measured frequency range includes a span of 200 MHz about a center frequency (indicated by marker 910) of 1.090 GHz. Trace 920 represents the relevant performance specification for the RF power amplifier and trace 930 represents the measured frequency spectrum plot. As can be seen from FIG. 9, the measured frequency spectrum is within the desired specification for the entire measured range.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A multi-stage RF power amplifier comprising:
a first RF power transistor;
a second RF power transistor; and
a passive network including a passive bandpass filter and a passive impedance matching network, the passive impedance matching network coupled in series between the first RF power transistor and the second RF power transistor;
wherein the passive impedance matching network includes a microstrip impedance matching network.

2. The multi-stage RF power amplifier as claimed in claim 1, wherein the passive bandpass filter includes a microstrip step bandpass filter.

3. The multi-stage RF power amplifier as claimed in claim 1, wherein the passive bandpass filter includes an LC filter comprising at least one discrete inductor and at least one discrete capacitor.

4. The multi-stage RF power amplifier as claimed in claim 1, further comprising an input and an output; and a first additional passive network coupled between the input and the first RF power transistor.

5. The multi-stage RF power amplifier as claimed in claim 4, further comprising a second additional passive network coupled between the second RF power transistor and the output.

6. A multi-stage RF power amplifier comprising:
an input;
an output;
a plurality of amplifier stages coupled in series between the input and the output; and
a plurality of passive networks including a first passive network coupled between the input and a first one of the plurality of amplifier stages, and a second passive network coupled between a last one of the plurality of amplifier stages and the output;
wherein a remainder of the plurality of passive networks are coupled in an arrangement having one passive network between each two amplifier stages of the plurality of amplifier stages;
wherein each passive network comprises a combination of a bandpass filter and an impedance matching network; and
wherein each of the plurality of passive networks comprises a microstrip impedance matching network and a microstrip step bandpass filter.

7. A multi-stage RF power amplifier comprising:
an input;
an output;
a plurality of amplifier stages coupled in series between the input and the output; and
a plurality of passive networks including a first passive network coupled between the input and a first one of the plurality of amplifier stages, and a second passive network coupled between a last one of the plurality of amplifier stages and the output;
wherein a remainder of the plurality of passive networks are coupled in an arrangement having one passive network between each two amplifier stages of the plurality of amplifier stages;
wherein each passive network comprises a combination of a bandpass filter and an impedance matching network; and
wherein each of the plurality of passive networks comprises a microstrip impedance matching network and an LC bandpass filter.

8. A multi-stage RF power amplifier comprising:
an input;
an output;
a plurality of amplifier stages coupled in series between the input and the output; and
a plurality of passive circuits, each passive circuit including a bandpass filter and an impedance matching network, and each passive circuit respectively coupled between two amplifier stages of the plurality of amplifier stages;
wherein each of the plurality of passive circuits comprises a microstrip impedance matching network and a microstrip step bandpass filter.

9. The multi-stage RF power amplifier as claimed in claim 8, wherein the plurality of amplifier stages comprises a first amplifier stage, a second amplifier stage and a third amplifier stage; and
wherein the plurality of passive circuits includes a first passive circuit coupled between the first amplifier stage and the second amplifier stage, and a second passive circuit coupled between the second amplifier stage and the third amplifier stage.

10. The multi-stage RF power amplifier as claimed in claim 8, wherein each amplifier stage of the plurality of amplifier stages comprises an RF power transistor.

11. A multi-stage RF power amplifier comprising:
an input;
an output;
a plurality of amplifier stages coupled in series between the input and the output; and
a plurality of passive circuits, each passive circuit including a bandpass filter and an impedance matching network, and each passive circuit respectively coupled between two amplifier stages of the plurality of amplifier stages;
wherein each of the plurality of passive circuits comprises a microstrip impedance matching network and an LC bandpass filter.

12. The multi-stage RF power amplifier as claimed in claim 11, wherein each amplifier stage of the plurality of amplifier stages comprises an RF power transistor.

13. The multi-stage RF power amplifier as claimed in claim 11, wherein the plurality of amplifier stages comprises a first amplifier stage, a second amplifier stage and a third amplifier stage; and
wherein the plurality of passive circuits includes a first passive circuit coupled between the first amplifier stage and the second amplifier stage, and a second passive circuit coupled between the second amplifier stage and the third amplifier stage.

* * * * *